(12) United States Patent
Wang et al.

(10) Patent No.: US 11,699,596 B2
(45) Date of Patent: Jul. 11, 2023

(54) METAL ETCHING WITH IN SITU PLASMA ASHING

(71) Applicant: Taiwan Semiconductor Manufacturing Co., Ltd., Hsinchu (TW)

(72) Inventors: Hsing-Hsiang Wang, Hsin-Chu (TW); Yu-Hsiang Lin, Hsin-Chu (TW); Wei-Da Chen, Hsin-Chu (TW); Tom Peng, Hsin-Chu (TW); P. Y. Chiu, Hsin-Chu (TW); Miau-Shing Tsai, Hsin-Chu (TW); Cheng-Yi Huang, Hsin-Chu (TW); Ching-Horng Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/684,438

(22) Filed: Nov. 14, 2019

(65) Prior Publication Data

US 2020/0176269 A1   Jun. 4, 2020

Related U.S. Application Data

(60) Provisional application No. 62/773,654, filed on Nov. 30, 2018.

(51) Int. Cl.
| | |
|---|---|
| *H01L 21/321* | (2006.01) |
| *H01L 21/3213* | (2006.01) |
| *H01L 21/027* | (2006.01) |
| *H01L 21/3105* | (2006.01) |
| *H01J 37/32* | (2006.01) |

(Continued)

(52) U.S. Cl.
CPC .... *H01L 21/32139* (2013.01); *H01J 37/3211* (2013.01); *H01J 37/32715* (2013.01); *H01L 21/0273* (2013.01); *H01L 21/31058* (2013.01); *H01L 21/32133* (2013.01); *H01L 21/67069* (2013.01); *H01L 21/67167* (2013.01); *H01L 21/67201* (2013.01); *H01L 21/67742* (2013.01); *H01L 21/6833* (2013.01); *H01J 2237/3342* (2013.01)

(58) Field of Classification Search
None
See application file for complete search history.

(56) References Cited

U.S. PATENT DOCUMENTS 6,221,772 B1 *  4/2001  Yang .................... C11D 7/02
                                              257/E21.256
6,323,121 B1 * 11/2001  Liu ................ H01L 21/02063
                                              257/E21.226

(Continued)

FOREIGN PATENT DOCUMENTS

| CN | 101046626 A | 10/2007 |
|---|---|---|
| TW | 201738931 A | 11/2017 |

*Primary Examiner* — Roberts P Culbert
(74) *Attorney, Agent, or Firm* — Duane Morris LLP (57) ABSTRACT

In an embodiment, a method includes: receiving, within a processing chamber, a wafer with a photoresist mask above a metal layer, wherein the processing chamber is connected to a gas source; applying an etchant configured to etch the metal layer in accordance with the photoresist mask within the processing chamber; and applying gas from the gas source to perform plasma ashing in the processing chamber.

17 Claims, 7 Drawing Sheets

(51) Int. Cl.
*H01L 21/67* (2006.01)
*H01L 21/677* (2006.01)
*H01L 21/683* (2006.01)

(56) References Cited

U.S. PATENT DOCUMENTS

| | | | |
|---|---|---|---|
| 2001/0005635 A1* | 6/2001 | Kitagawa | H01L 21/31138 438/710 |
| 2006/0063388 A1* | 3/2006 | Yang | H01L 21/02071 438/745 |
| 2006/0144817 A1* | 7/2006 | Balasubramaniam | H01L 21/31138 216/59 |
| 2006/0199370 A1* | 9/2006 | Dai | H01L 21/76814 438/624 |
| 2019/0062925 A1* | 2/2019 | Huo | C23F 4/00 |

* cited by examiner

METAL ETCHING WITH IN SITU PLASMA ASHING

CROSS-REFERENCE TO RELATED APPLICATION

The present application claims priority to U.S. Provisional Patent Application No. 62/773,654, filed on Nov. 30, 2018, which is incorporated by reference herein in its entirety.

BACKGROUND

Typical processing of wafers (e.g., semiconductor workpieces, semiconductor devices, or semiconductor materials) may utilize separate chambers for etching and plasma ashing. Etching may be used to remove material from the surface of a wafer during manufacturing. For example, in etching, parts of the wafer may be protected from etching by a masking material which resists etching. Then, the wafer may be etched by application of an etchant to exposed portions of the wafer. Etching is typically performed in an etching chamber specific for etching.

Plasma ashing may be the process of removing the photoresist from an etched wafer. Using a plasma source, a reactive species is generated. The reactive species combines with the photoresist to form ash which may be removed with a vacuum pump. Plasma ashing is typically performed in an ashing chamber (e.g., a photoresist stripping chamber and/or a cooling chamber) that is separate from the etching chamber. Such processing techniques require large amounts of overhead, but still fail to produce satisfactory results. Therefore, conventional processing techniques are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of metal etching with plasma ashing performed in situ within a semiconductor processing chamber. In certain embodiments, etching may be performed with a photoresist mask above a metal layer within the processing chamber (e.g., the semiconductor processing chamber). This processing chamber may be connected to a gas source. In the performance of etching, an exposure system (e.g., a delivery system of an etchant) may be applied in the processing chamber to etch the metal layer in accordance with the photoresist mask. Upon the completion of etching, an ashing gas may be applied from a gas source to perform plasma ashing within the processing chamber. As noted above, this processing chamber may be the same for both etching and ashing and thus no separate etching chamber, photoresist stripping chamber and/or cooling chamber may be needed. Rather, the functions of each of these may be performed in a single chamber in a simplified process of etching and plasma ashing. Stated another way, there may be no de-chucking (e.g., removing an etched wafer from a chuck it is secured on) between etching and plasma ashing.

In various embodiments, the ashing gas may be at least one of: pure oxygen ($O_2$), pure nitrogen ($N_2$), and a mixture of $N_2$ and $O_2$. In particular embodiments, the mixture of $N_2$ and $O_2$ may include less than 10 percent of $O_2$. As will be noted below, the ashing gas may be transformed into plasma within the processing chamber (e.g., via a source power). The $O_2$ within the plasma may react (e.g., combine) with the photoresist to produce ash (e.g., removing the photoresist). More specifically, the $O_2$ within the plasma may react (e.g., combine) with the photoresist to produce carbon dioxide ($CO_2$), carbon monoxide ($CO$), and water ($H_2O$) that may be removed from the processing chamber by suction forces or a pump. Also, the $N_2$ within the plasma may react with any residual aluminum chloride ($AlCl_3$) in the processing chamber. This $AlCl_3$ may be produced as a byproduct of etching. For example, the $N_2$ within the plasma may react with the residual $AlCl_3$ to produce aluminum nitride ($AlN$) and chlorine ($Cl_2$) that may be removed from the processing chamber by suction forces or a pump. The removal of $AlCl_3$ within the processing chamber may decrease the chance of corrosion within the processing chamber.

In various embodiments, the plasma ashing may be performed by applying a source power of over 1600 watts. As will be illustrated below, this source power may be applied to at least one coil within a processing chamber. This processing chamber may have a wall (e.g., a ceiling or a dome) that separates the at least one coil from the metal layer. Also, the metal layer may be within a space formed or enclosed by the wall. In particular embodiments, the plasma ashing may be performed by applying a bias power of about 0 watts. This bias power may be applied at an electrostatic chuck that supports (e.g., sits on) the wafer that had previously been etched (e.g., previously before plasma ashing). In certain embodiments, a pressure of less than 100 millitorr may be applied at the processing chamber during the performance of plasma ashing. Also, the processing chamber may be maintained at about 50 degrees centigrade, or at a same temperature at which etching was performed. In further embodiments, the processing chamber may be maintained at a temperature of less than 100 degrees centigrade across both etching and plasma ashing.

In various embodiments, the processing chamber may be part of a semiconductor processing workstation with at least one loadlock for ingress or egress of a wafer. In certain embodiments, this wafer may have a diameter of about 200 millimeters or a diameter of about 8 inches. This semiconductor processing workstation may be configured to move the wafer from a loadlock to an alignment chamber, from the alignment chamber to the processing chamber, and then from the processing chamber to the loadlock for egress of the wafer from the semiconductor processing workstation (e.g., without moving the wafer from the processing chamber to a photoresist stripping chamber and/or a cooling chamber). Accordingly, the processing chamber may include various conduits for ingress of an etchant and an ashing gas as well as for egress of ash produced during the plasma ashing from the processing chamber via suction forces. In particular embodiments, the processing chamber may be a modified decoupled plasma source (DPS) chamber.

Advantageously, performing in situ plasma ashing may simplify semiconductor workpiece processing (e.g., semiconductor wafer or device processing) by not requiring further processing in a photoresist stripping chamber and/or a cooling chamber. Rather, in a single workstation with multiple processing chambers, a semiconductor workpiece may be received in a loadlock, aligned, and then etched and photoresist stripped in a single processing chamber, and then removed from the workstation without processing at separate etching, photoresist stripping and/or cooling chambers. As noted above, this in situ plasma ashing may include processing under a high source power environment of over 1600 watts with 0 watts of bias power and in a gaseous environment with either a $O_2$ gas, a $N_2$, or a gas mixture of $N_2$ and $O_2$ gases. Accordingly, etching and plasma ashing may be performed together in a single processing chamber that is configured with an exposure system (e.g., system for introduction of an etchant) for etching based on a photoresist mask and an ashing gas source. In particular embodiments, in situ plasma ashing may be performed with the addition of, or alternative use of, other gases such as $H_2$, $H_2O$, $H_2O_2$, $O_3$, CO, $CO_2$, $SO_2$, Ar, He, and the like. In further embodiments, the total wafer temperature during and after in situ ashing may be less than 100 degrees Celsius, which may be relatively low in comparison to a possible 250 degrees Celsius or more in certain plasma ashing chambers separate from an etching chamber.

Figure 1:
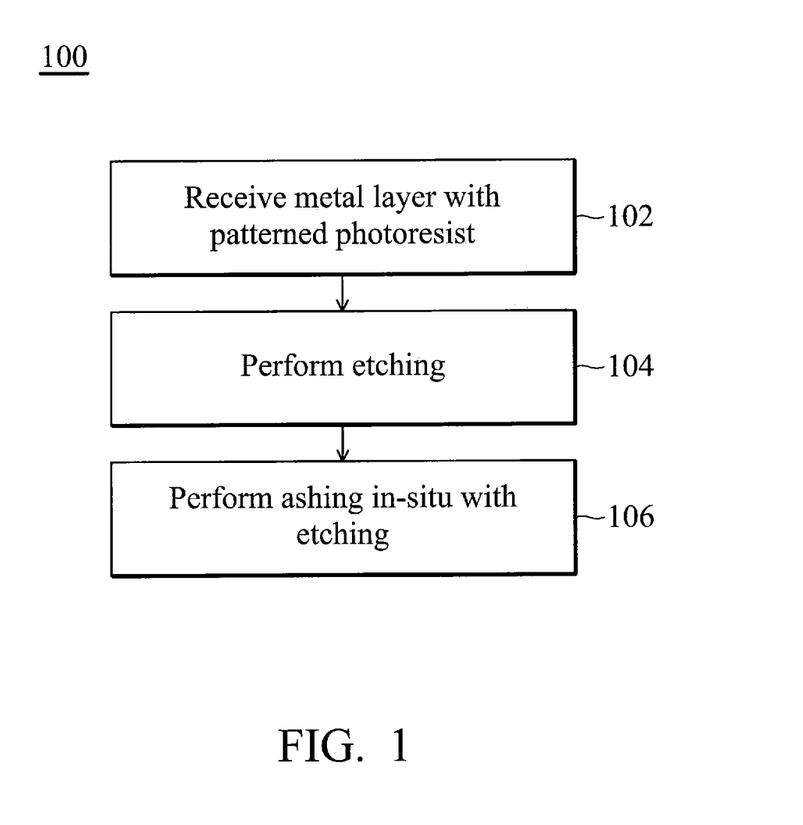
FIG. 1 illustrates a flowchart of a method of metal etching with plasma ashing performed in situ within a semiconductor processing chamber according to one or more embodiments of the present disclosure.

FIG. 1 illustrates a flowchart of a method 100 of metal etching with plasma ashing performed in situ within a semiconductor processing chamber according to one or more embodiments of the present disclosure. It is noted that the method 100 is merely an example, and is not intended to limit the present disclosure. Accordingly, it is understood that additional operations may be provided before, during, and after the method 100 of FIG. 1, certain operations may be omitted, and some other operations may only be briefly described herein.

Figure 2A:
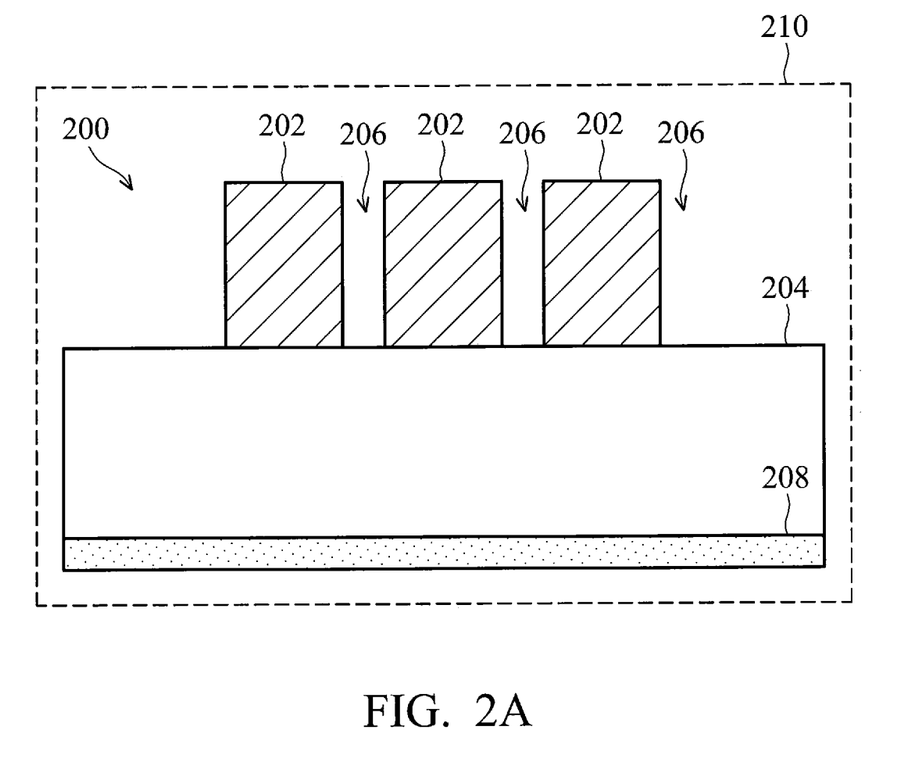
FIGS. 2A, 2B, and 2C illustrate cross-sectional views of an exemplary semiconductor device during various fabrication stages, made by the method of FIG. 1, in accordance with some embodiments.
Figure 2B:
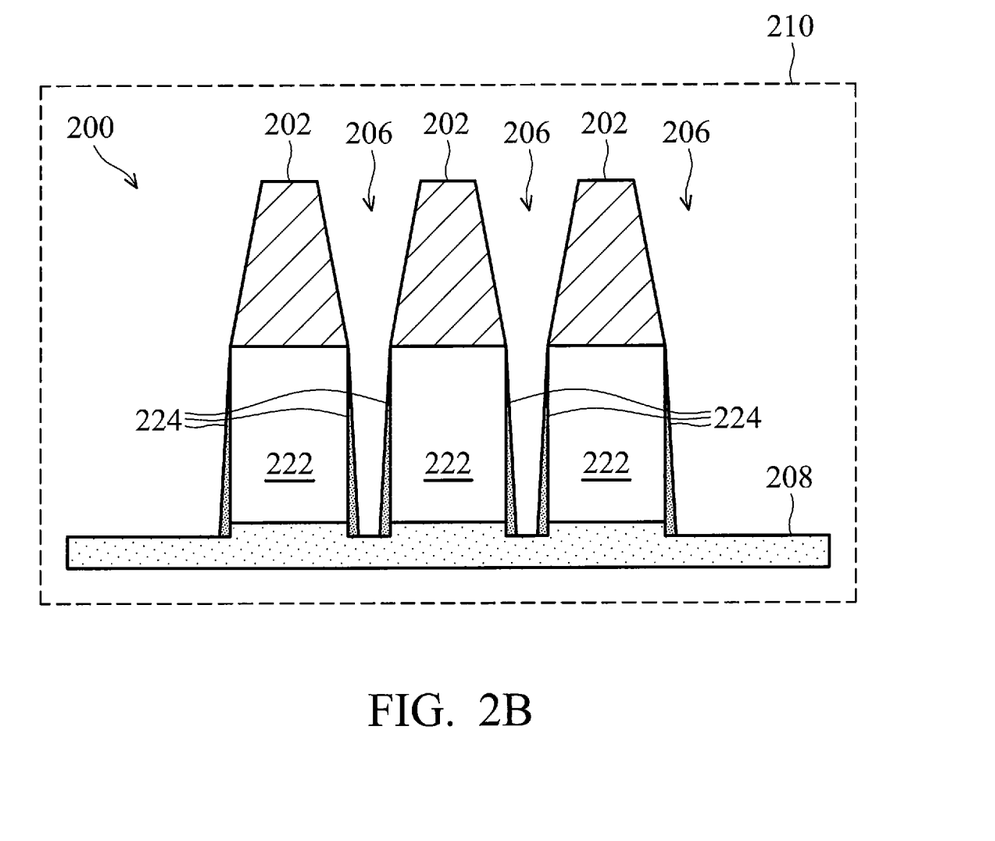
Figure 2C:
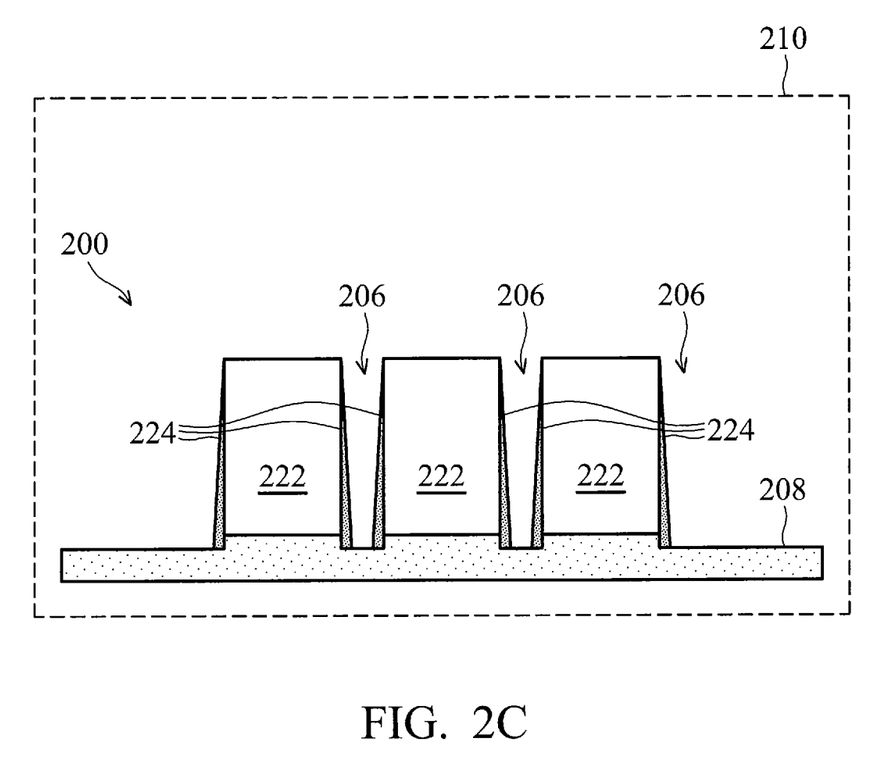

In some embodiments, operations of the method 100 may be associated with the cross-sectional views of a semiconductor device at various fabrication stages as shown in FIGS. 2A, 2B, and 2C respectively, which will be discussed in further detail below.

Referring now to FIG. 1, the method 100 starts with operation 102 in which a metal layer with a patterned photoresist is provided at a processing chamber. The method 100 continues to operation 104 where etching is performed within the processing chamber. The method 100 continues to operation 106 where plasma ashing is performed in-situ with the processing chamber that performed the etching.

As mentioned above, FIG. 2A through FIG. 2C illustrate, in a cross-sectional views, respective portions of a semiconductor device 200 at various fabrication stages of the method 100 of FIG. 1. The semiconductor device 200 may include, be included in, or be a microprocessor, memory cell, wafer, and/or other integrated circuit (IC). Also, FIGS. 2A through 2C are simplified for a better understanding of the concepts of the present disclosure. For example, although the figures illustrate the semiconductor device 200, it is understood the IC may comprise a number of other devices such as resistors, capacitors, inductors, fuses, etc., which are not shown in FIGS. 2A-2C, for purposes of clarity of illustration.

FIG. 2A is a cross-sectional view of a semiconductor device 200 including a photoresist 202 at one of the various stages of fabrication corresponding to operation 102 of FIG. 1, in accordance with some embodiments. The photoresist 202 may overlay a metal layer 204. The photoresist 202 may be patterned such that the photoresist 202 does not completely overlay the metal layer 204 but includes various openings 206 in which the metal layer 204 is exposed. In various embodiments, the metal layer 204 may be a metal composite layer. This metal composite layer may include a top layer of, for example, a barrier material that will be discussed further below. Optionally, the metal layer may overlay an under layer 208 (e.g., a substrate). As noted above, the semiconductor device 200 may be part of a wafer resting on (e.g., secured on and/or contacting) an electrostatic chuck within a processing chamber 210 (illustrated with dotted lines). The processing chamber 210 may be a generally enclosed region where both etching and plasma ashing may take place in-situ. In certain embodiments, the photoresist may be applied to the metal layer 204 within the processing chamber 210 (e.g., the photoresist 202 may be put on the metal layer 204 within the processing chamber 210). In particular embodiments, the semiconductor device 200 with the photoresist on top of the metal layer 204 may be received at the processing chamber 210.

In some embodiments, the under layer 208 includes a silicon substrate or a silicon oxide substrate. Alternatively, the under layer 208 may include other elementary semiconductor materials such as, for example, germanium. The under layer 208 may also include a compound semiconductor such as silicon carbide, gallium arsenic, indium arsenide, and indium phosphide. The under layer 208 may include an alloy semiconductor such as silicon germanium, silicon germanium carbide, gallium arsenic phosphide, and gallium indium phosphide. In one embodiment, the under layer 208 includes an epitaxial layer. For example, the under layer may have an epitaxial layer overlying a bulk semiconductor. Furthermore, the under layer 208 may include a semiconductor-on-insulator (SOI) structure. For example, the under layer may include a buried oxide (BOX) layer formed by a process such as separation by implanted oxygen (SIMOX) or other suitable technique, such as wafer bonding and grinding.

In some embodiments, the under layer 208 also includes various conductive features, such as p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various active devices (or integrated circuit (IC) devices), such as a complimentary metal-oxide-semiconductor field-effect transistor (CMOSFET), imaging sensor, and/or light emitting diode (LED). The under layer 208 may further include other conductive features, or active devices (functional features) such as a resistor or a capacitor formed in and on the substrate. The under layer 208 may further includes lateral isolation features provided to separate various conductive features or devices formed in the under layer 208. In one embodiment, shallow trench isolation (STI) features are used for lateral isolation. The various devices further include silicide disposed on S/D, gate and other device features for reduced contact resistance when coupled to output and input signals.

In certain embodiments, the under layer 208 may be a dielectric layer. The dielectric layer may form a non-conductive (e.g., dielectric) separation, or isolation, between conductive elements within the semiconductor device. The dielectric layer may include a non-conductive material that is at least one of: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials.

In certain embodiments, the metal layer 204 may be part of a metal line. For example, the metal layer may be a metal line connected to, or part of, a source, drain or gate electrode of a transistor device, an electrode of a capacitor, one end of a resistor or of any other active or passive device. As a further example, the metal layer 204 may connect to other conductive lines and/or vias within the semiconductor device 200. In some embodiments, the metal layer 204 may include conductive materials, such as a metal, or for example, aluminum (Al), copper (Cu), tungsten (W), or a combination thereof. In some other embodiments, the metal layer 204 may include other suitable conductive materials (e.g., metal materials such as gold (Au), cobalt (Co), silver (Ag), Nickle (Ni), etc. and/or conductive materials (e.g., polysilicon)) while remaining within the scope of the present disclosure. The metal layer 204 may be formed by using chemical vapor deposition (CVD), physical vapor deposition (PVD), spin-on coating, and/or other suitable techniques to deposit the metal layer 204 over the under layer 208.

In some embodiments, optionally, the metal layer 204 may include a barrier material on top that enhance (e.g., improves) conductivity of conductive materials and may effectively prevent (e.g., block) metal atoms from diffusing from conductive materials into non-conductive materials during a deposition process to form a conductive line. Examples of barrier materials include tantalum nitride (TaN), tantalum (Ta), titanium nitride (TiN), titanium (Ti), cobalt tungsten (CoW), tungsten nitride (WN), or the like.

In the following discussion, reference to the metal layer 204 may or may not include their corresponding barrier material deposited as a layer on top of the metal layer 204. In various embodiments, the barrier layer does not change the function of any adjoining conductive structure except to enhance the material properties of the adjoining conductive structures.

In particular embodiments, the photoresist 202 may be a light-sensitive material used to etch the metal layer 204. This photoresist 202 may be applied on top of the metal layer 204. In certain embodiments, this photoresist 202 may be applied directly on top of the metal layer 204 (e.g., directly contacting the uniform material of the metal layer 204). In further embodiments, the photoresist 202 may be applied on top of the metal layer 204 such that the photoresist 202 is on top of a barrier material of the metal layer 204 (e.g., a layer of barrier material that forms the upper surface of the metal layer 204.)

In certain embodiments, the photoresist 202 may be a light-sensitive organic material deposited on the metal layer 204. The photoresist may be formed (e.g., patterned) by applying a patterned mask to block light incident upon the photoresist, so that only unmasked regions of the material will be exposed to light. A solvent, may then applied to the photoresist. In the case of a positive photoresist, the photoresist material is degraded by light and the solvent will dissolve away the regions that were exposed to light, leaving behind the photoresist where the patterned mask was placed. In the case of a negative photoresist, the photosensitive material is strengthened (e.g., polymerized or cross-linked) by light, and the solvent will dissolve away only the regions that were not exposed to light, leaving behind the photoresist in areas where the patterned mask was not placed. As will be discussed further below, the photoresist may then be used as a mask to perform one or more dry/wet etching processes to respectively or simultaneously etch the metal layer 204.

FIG. 2B is a cross-sectional view of the semiconductor device 200 after etching at one of the various stages of fabrication that corresponds to operation 106 of FIG. 1, in accordance with some embodiments. More specifically, the semiconductor device 200 after etching may form an etched metal layer 222. This etched metal layer 222 may be formed by using the photoresist 202 as a mask to perform one or more etching processes to respectively or simultaneously etch the metal layer to form the etched metal layer 222. A wet etching process may reference use of a wet etchant for etching and a dry etching process may reference use of a dry etchant for etching. Examples of a wet etchant may include, for example, hydrofluoric acid (HF), phosphoric acid ($H_3PO_4$), acetic acid, nitric acid ($HNO_3$), water ($H_2O$), and the like. Examples of a dry etchant (also referred to as an etchant plasma or an etchant gas) may include, for example, tetrafluoromethane ($CF_4$), fluoroform ($CHF_3$), difluoromethane ($CH_2F_2$), octafluorocyclobutane ($C_4F_8$), argon (Ar), oxygen ($O_2$), and the like.

In various embodiments, when the metal layer is aluminum (Al), an applied wet etchant for wet etching may be, for example, 80% phosphoric acid ($H_3PO_4$)+5% acetic acid+5% nitric acid ($HNO_3$)+10% water ($H_2O$) applied at about 50 degrees centigrade, or from about 30 degrees centigrade to about 60 degrees centigrade. In further embodiments, when the metal layer is aluminum (Al), an applied dry etchant may be, for example, $Cl_2$, $CCl_4$, $SiCl_4$, and/or $BCl_3$ at about 50 degrees centigrade, or from about 30 degrees centigrade to about 60 degrees centigrade. In particular embodiments, etching may produce an etching byproduct, $AlCl_3$.

In particular embodiments, a polymer 224 may be present on the sidewalls of the etched metal layer 222. This polymer may be a byproduct of etching the metal layer to form the etched metal layer 222. In addition to the formation of the etched metal layer 222, etching of the semiconductor device 200 may also cause some etching (e.g., erosion) of the photoresist 202 and the under layer 208 as illustrated in FIG. 2B. In particular embodiments, etching may produce an etching byproduct, $AlCl_3$.

FIG. 2C is a cross-sectional view of the semiconductor device 200 after plasma ashing at one of the various stages of fabrication that corresponds to operation 106 of FIG. 1, in accordance with some embodiments. Plasma ashing may refer to a process of removing the photoresist after etching. As illustrated, after plasma ashing, the etched metal layer 222 may not include an overlaying photoresist. More specifically, using a plasma source, a monatomic (single atom) substance (also referred to as a reactive species or an ashing gas) may be introduced to the processing chamber 210. The ashing gas may combine with the photoresist to form ash which is removed from the processing chamber 210 with a vacuum pump.

In various embodiments, plasma is created by exposing the ashing gas (e.g., reactive species) at a low pressure to high power radio waves, which ionise the ashing gas. This process may be done under vacuum in order to better create the plasma. In certain embodiments, the plasma may be generated in situ in the process chamber. However, in other embodiments, the plasma may be formed remotely from the process chamber where the desired particles for ashing are separated from the formed plasma and channeled to the wafer within the process chamber. By forming the plasma remotely, electrically charged particles may have time to recombine before they reach the photoresist surface to avoid damage to the wafer surface from plasma formation.

In various embodiments, the ashing gas may be at least one of: pure oxygen ($O_2$), pure nitrogen ($N_2$), and a mixture of $N_2$ and $O_2$. In particular embodiments, the mixture of $N_2$ and $O_2$ may include less than 10 percent of $O_2$. The ashing gas may be transformed into plasma within the processing chamber (e.g., via a source power for high power radio waves). For example, $O_2$ may be used as a major plasma source to react with the photoresist in accordance with the below formula:

$$CxHyOz + O_2 \rightarrow CO_2 + CO + H_2O \quad (1)$$

The CxHyOz may represent the photoresist, the $O_2$ may represent the plasma, and the $CO_2+CO+H_2O$ may be removed by a pump (e.g., via suction forces from the processing chamber). Stated another way, the $O_2$ within the plasma may react (e.g., combine) with the photoresist to produce ash (e.g., removing the photoresist). More specifically, the $O_2$ within the plasma may react (e.g., combine) with the photoresist to produce carbon dioxide ($CO_2$), carbon monoxide (CO), and water ($H_2O$) that may be removed from the processing chamber by suction forces or a pump.

Also, $N_2$ may be used to react with an etch byproduct $AlCl_3$ (introduced above) to avoid corrosion in accordance with the below formula:

$$AlCl_3 + N_2 \rightarrow AlN + Cl_2 \quad (2)$$

The $AlCl_3$ may represent a byproduct, the $N_2$ may represent the plasma, and the resultant $AlN+Cl_2$ may be removed by a pump (e.g., via suction forces from the processing chamber). Stated another way, the $N_2$ within the plasma may react with the residual $AlCl_3$ to produce aluminum nitride (AlN) and chlorine ($Cl_2$) that may be removed from the processing chamber by suction forces or a pump. The removal of $AlCl_3$ within the processing chamber may decrease the chance of corrosion within the processing chamber.

Accordingly, in various embodiments, the corrosion formula may be represented in a chain reaction as follows:

$$AlCl_3 + 3H_2P \rightarrow Al(OH)_3 + 3HCl \quad (3)$$

$$Al(OH)_3 + 3HCl + 3H_2O \rightarrow Al_2O_3 + 9H_2O + 6HCl \quad (4)$$

$$2Al + 6HCl \rightarrow 2AlCl_3 + 3H_2 \quad (5)$$

In various embodiments, the plasma ashing may be performed by applying a source power of over 1600 watts. As will be illustrated below, this source power may be applied to at least one coil within a processing chamber with a wall (e.g., a ceiling or a dome) that has multiple coils separated from an etched metal layer facing by the wall. In particular embodiments, the plasma ashing may be performed by applying a bias power of about 0 watts. This bias power may be applied at an electrostatic chuck that supports the wafer that had previously been etched (e.g., previously before plasma ashing). In certain embodiments, a pressure of less than 100 millitorr may be applied the processing chamber during the performance of plasma ashing. Also, the processing chamber may be maintained at range of 40 to 60 degrees centigrade. In some embodiments, the processing chamber temperature is about 50 degrees centigrade. Although certain processing conditions may be utilized in certain embodiments, other processing conditions may be utilized in other embodiments as desired for different applications in various embodiments.

Figure 3:
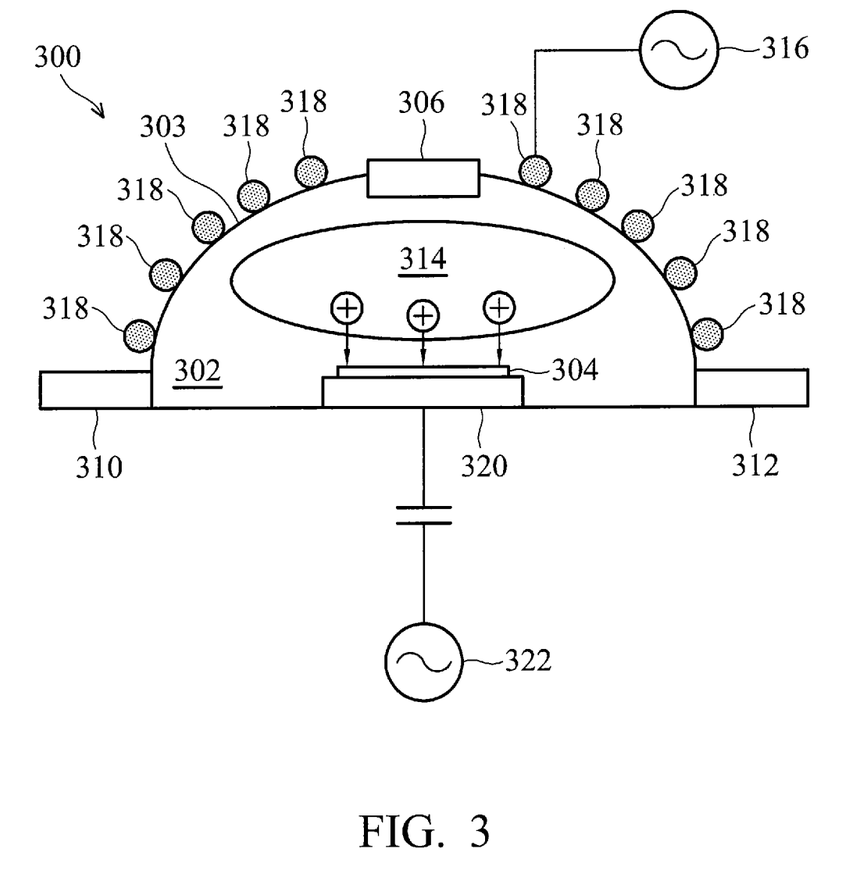
FIG. 3 is a diagram of a processing chamber, in accordance with some embodiments.

FIG. 3 is a diagram of a processing chamber 300, in accordance with some embodiments. The processing chamber 300 may include an enclosed area 302 in which both metal etching and plasma ashing are performed in situ. The processing chamber may include a wall 303 that defines the enclosed area 302. In certain embodiments, the wall 303 may be formed substantially as a dome. A wafer 304 may be located within the enclosed area 302 for etching and plasma ashing. More specifically, this wafer 304 may include a metal layer for etching within the enclosed area 302 of the processing chamber 300. An etchant may be provided into the processing chamber 300 via an etchant conduit 306 from an etchant source (not illustrated). This etchant conduit 306 may, for example, provide an etchant that is an wet etchant for wet etching and/or a dry etchant for dry etching. Examples of a wet etchant may include, for example, hydrofluoric acid (HF), phosphoric acid ($H_3PO_4$), acetic acid, nitric acid ($HNO_3$), water ($H_2O$), and the like. Examples of a dry etchant (also referred to as an etchant plasma or an etchant gas) may include, for example, tetrafluoromethane ($CF_4$), fluoroform ($CHF_3$), difluoromethane ($CH_2F_2$), octafluorocyclobutane ($C_4F_8$), argon (Ar), oxygen ($O_2$), and the like.

In various embodiments, when the metal layer is aluminum (Al), an applied wet etchant for wet etching may be, for example, 80% phosphoric acid ($H_3PO_4$)+5% acetic acid+5% nitric acid ($HNO_3$)+10% water ($H_2O$) applied at about 50 degrees centigrade, or from about 30 degrees centigrade to about 60 degrees centigrade. In further embodiments, when the metal layer is aluminum (Al), an applied dry etchant may be, for example, $Cl_2$, $CCl_4$, $SiCl_4$, and/or $BCl_3$ at about 50 degrees centigrade, or from about 30 degrees centigrade to about 60 degrees centigrade. In particular embodiments, etching may produce an etching byproduct, $AlCl_3$.

As noted above, plasma ashing may be performed in situ within the enclosed area 302 of the processing chamber 300 (e.g., in the same location in which etching was performed).

Plasma ashing may refer to a process of removing the photoresist after etching. An ashing gas may be provided into the processing chamber 300 via an ashing conduit 310 from an ashing gas source (not illustrated) for plasma ashing. This ashing conduit 310 may, for example, provide an ashing gas for plasma ashing within the enclosed area 302 of the processing chamber 300. This ashing gas may be, for example, a monatomic (single atom) substance (also referred to as a reactive species). The ashing gas may combine with the photoresist to form ash which is removed from the processing chamber 210 with a vacuum pump 312 (e.g., removed via suction forces).

In various embodiments, plasma 314 is created by exposing the ashing gas (e.g., reactive species) at a low pressure (e.g., less than 100 millitorr) to high power radio waves, which ionise the ashing gas. In certain embodiments, this process may be done under vacuum in order to better create the plasma 314. In various embodiments, the ashing gas may be at least one of: pure oxygen ($O_2$), pure nitrogen ($N_2$), and a mixture of $N_2$ and $O_2$. In particular embodiments, the mixture of $N_2$ and $O_2$ may include 0 to 10 percent of $O_2$.

In particular embodiments, the plasma ashing may be performed by applying a source power 316 of over 1600 watts. This source power 316 may be applied each of a number of coils 318 within the processing chamber. For simplicity of illustration, the connection between the source power 316 and the coils 318 is only illustrated with a single connection with a single coil to represent the respective connections from each of the coils 318 to the source power 316.

In further embodiments, the enclosed area 302 may include an electrostatic chuck 320 on which the wafer 304 is secured. The electrostatic chuck 320 may be supplied with a bias power 322 (e.g., a radio frequency bias power). This bias power may be applied to calibrate the amount of downward force the plasma 314 may experience to bombard the wafer 304. In certain embodiments, the bias power may be about 0 watts during plasma ashing. In certain embodiments, a pressure of less than 100 millitorr may be applied the processing chamber during the performance of plasma ashing. Also, the processing chamber may be maintained at about 50 degrees centigrade. In particular embodiments, after plasma ashing the wafer 304 may be de-chucked (e.g., removed from the electrostatic chuck 320 and removed from the processing chamber 300 (e.g., via a robotic arm).

Figure 4:
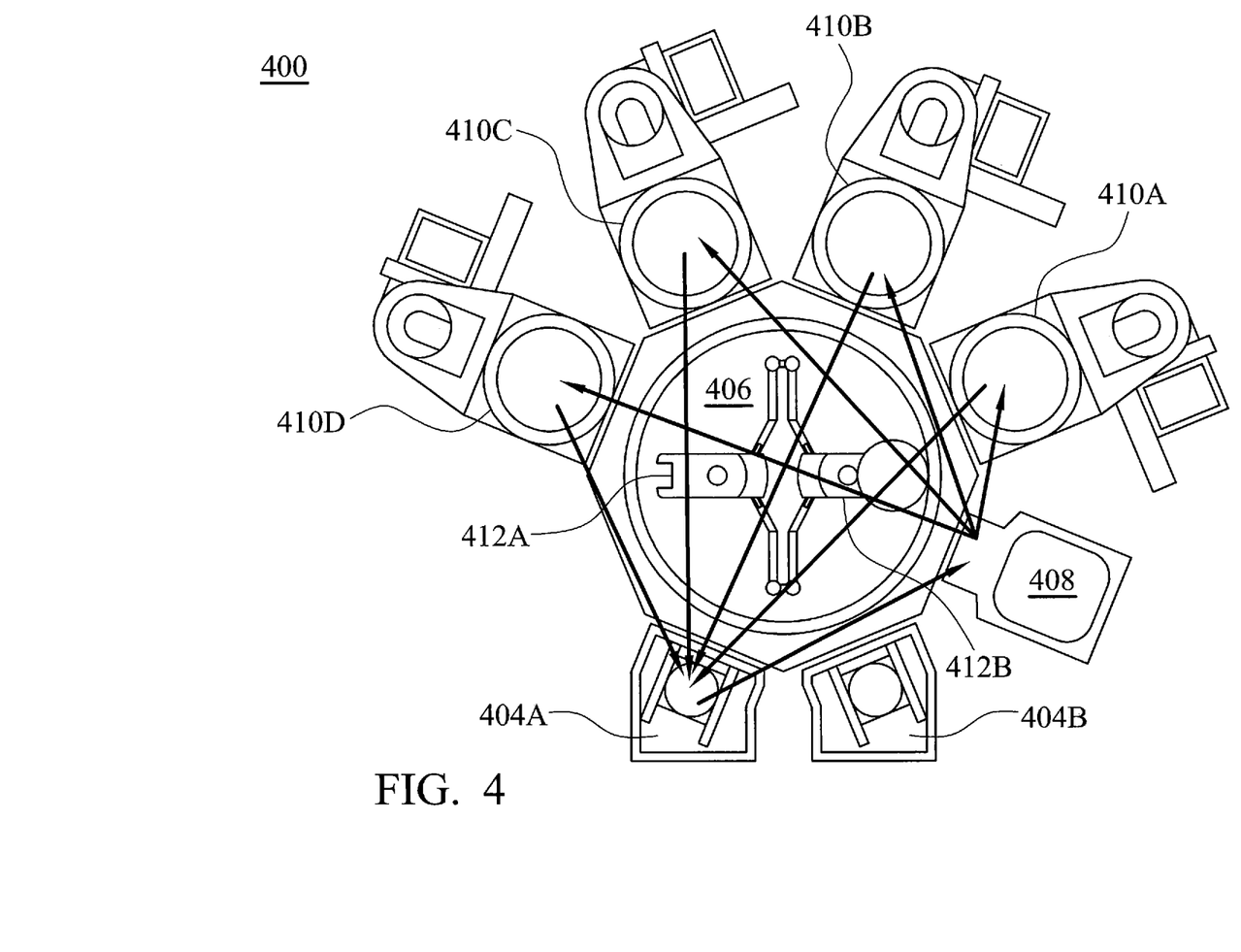
FIG. 4 is an illustration of a workstation, in accordance with some embodiments.

FIG. 4 is an illustration of a workstation 400, in accordance with some embodiments. The workstation 400 may include loadlocks 404A, 404B, a transfer chamber 406, an alignment chamber 408, and multiple processing chambers 410A-410D for both etching and plasma ashing in situ within each of the multiple processing chambers 410A-410D.

The transfer chamber 406 may include a first robotic arm 412A and a second robotic arm 412B. The first robotic arm 412A and the second robotic arm 412B may be referred to as a robotic arm system. The robotic arm system of the first robotic arm 412A and the second robotic arm 412B may be configured to transfer wafers among the loadlocks 404A, 404B, the alignment chamber 408, and the multiple processing chambers 410A-410D. The first robotic arm 412A may be opposite the second robotic arm 412B and thus the robotic arm system may be configured to handle up to two wafers at a single time. Also, the robotic arm system may be configured to swivel about to face each of the loadlocks 404A, 404B, the alignment chamber 408, and the multiple processing chambers 410A-410D as desired. Also, each robotic arm 412A and 412B may be configured to extend and/or retract from the loadlocks 404A, 404B, the alignment chamber 408, and/or the multiple processing chambers 410A-410D as desired to place and/or remove a wafer from the loadlocks 404A, 404B, the alignment chamber 408, and/or the multiple processing chambers 410A-410D as desired. Furthermore, each of the loadlocks 404A, 404B, the alignment chamber 408, and/or the multiple processing chambers 410A-410D may include a portal into and from which each robotic arm 412A and 412B may extend. Accordingly, each respective portal may also close to seal each of the loadlocks 404A, 404B, the alignment chamber 408, and/or the multiple processing chambers 410A-410D when access via the robotic arm 412A and 412B is not desired.

The loadlocks 404A, 404B may be configured to interface with a system external to the workstation 400. For example, the loadlocks 404A, 404B may be configured to interface with an automated material handling system that may place and/or remove wafers from the loadlocks 404A, 404B.

The alignment chamber 408 may be configured to align a wafer on the robotic arm system. For example, the alignment chamber 408 may include a sensor and/or an actuator to determine an orientation of the wafer on the robotic arm system (e.g., when on or interfaced with the robotic arm 412A 412B) and to move the wafer into a desired orientation (e.g., angular orientation) with the robotic arm system. Then, the robotic arm system may move and deposit the wafer with the desired orientation on the robotic arm system into one of the multiple processing chambers 410A-410D.

Each of the multiple processing chambers 410A-410D may include an enclosed area in which both metal etching and plasma ashing are performed in situ. Accordingly, each processing chamber 410A-410D may include a wall that defines the enclosed area. In certain embodiments, the wall may be formed substantially as a dome. A wafer may be located within the enclosed area for etching and plasma ashing. More specifically, this wafer may include a metal layer for etching within the enclosed area of each processing chamber 410A-410D. An etchant may be provided into each processing chamber 410A-410D via an etchant conduit from an etchant source (not illustrated). This etchant conduit may, for example, provide an etchant that is an wet etchant for wet etching and/or a dry etchant for dry etching.

In various embodiments, when the metal layer is aluminum (Al), an applied wet etchant for wet etching may be, for example, 80% phosphoric acid ($H_3PO_4$)+5% acetic acid+5% nitric acid ($HNO_3$)+10% water ($H_2O$) applied at about 50 degrees centigrade, or from about 30 degrees centigrade to about 60 degrees centigrade. In further embodiments, when the metal layer is aluminum (Al), an applied dry etchant may be, for example, $Cl_2$, $CCl_4$, $SiCl_4$, and/or $BCl_3$ at about 50 degrees centigrade, or from about 30 degrees centigrade to about 60 degrees centigrade. In particular embodiments, etching may produce an etching byproduct, $AlCl_3$.

As noted above, plasma ashing may be performed in situ within the enclosed area of each processing chamber 410A-410D (e.g., in the same location in which etching was performed). An ashing gas may be provided into each processing chamber 410A-410D via an ashing conduit from an ashing gas source (not illustrated) for plasma ashing. This ashing conduit may, for example, provide an ashing gas for plasma ashing within the enclosed area of each processing chamber 410A-410D. The ashing gas may combine with the photoresist to form ash which is removed from each processing chamber 410A-410D with a respective vacuum pump.

In various embodiments, plasma 314 is created by exposing the ashing gas (e.g., reactive species) at a low pressure (e.g., less than 100 millitorr) to high power radio waves, which ionise the ashing gas. This process may be done under vacuum in order to better create the plasma 314. In various embodiments, the ashing gas may be at least one of: pure oxygen ($O_2$), pure nitrogen ($N_2$), and a mixture of $N_2$ and $O_2$. In particular embodiments, the mixture of $N_2$ and $O_2$ may include less than 10 percent of $O_2$.

In particular embodiments, the plasma ashing may be performed by applying a source power of over 1600 watts. This source power may be applied at each of a number of coils within each processing chamber 410A-410D. Also, each processing chamber 410A-410D may include an electrostatic chuck configured to secure a wafer during plasma ashing. The electrostatic chuck may be supplied with a bias power (e.g., a radio frequency bias power). In certain embodiments, the bias power may be about 0 watts during plasma ashing. In certain embodiments, a pressure of less than 100 millitorr may be applied in each processing chamber 410A-410D during the performance of plasma ashing. Also, each processing chamber 410A-410D may be maintained at about 50 degrees centigrade. In particular embodiments, after plasma ashing the wafer may be de-chucked (e.g., removed from the electrostatic chuck) and removed from a respective processing chamber 410A-410D via the first robotic arm 412A and/or the second robotic arm 412B. The wafer may then be moved back to one of the loadlocks 404A, 404B for egress from the workstation 400.

Accordingly, a wafer may be received at one of the loadlocks 404A, 404B. Then, the wafer may be aligned at the alignment chamber 408 (e.g., aligned with reference to the robotic arm system of the first robotic arm 412A and the second robotic arm 412B). Then, the wafer may be processed at one of the processing chambers 410A-410D in which both metal etching and plasma ashing are performed in situ (e.g., without de-chucking between the metal etching and plasma ashing). Then, finally, the wafer may be moved to one of the loadlocks 404A, 404B for egress from the workstation 400. Movement among the loadlocks 404A, 404B, the alignment chamber 408, and/or the multiple processing chambers 410A-410D may be made via the robotic arm system of the first robotic arm 412A and the second robotic arm 412B. Various arrows are illustrated over the workstation 400 to illustrate the path of a wafer for processing at the workstation 400. Accordingly, the wafer may be processed at one of but not more than one of the processing chamber 410A-410D.

Figure 5:
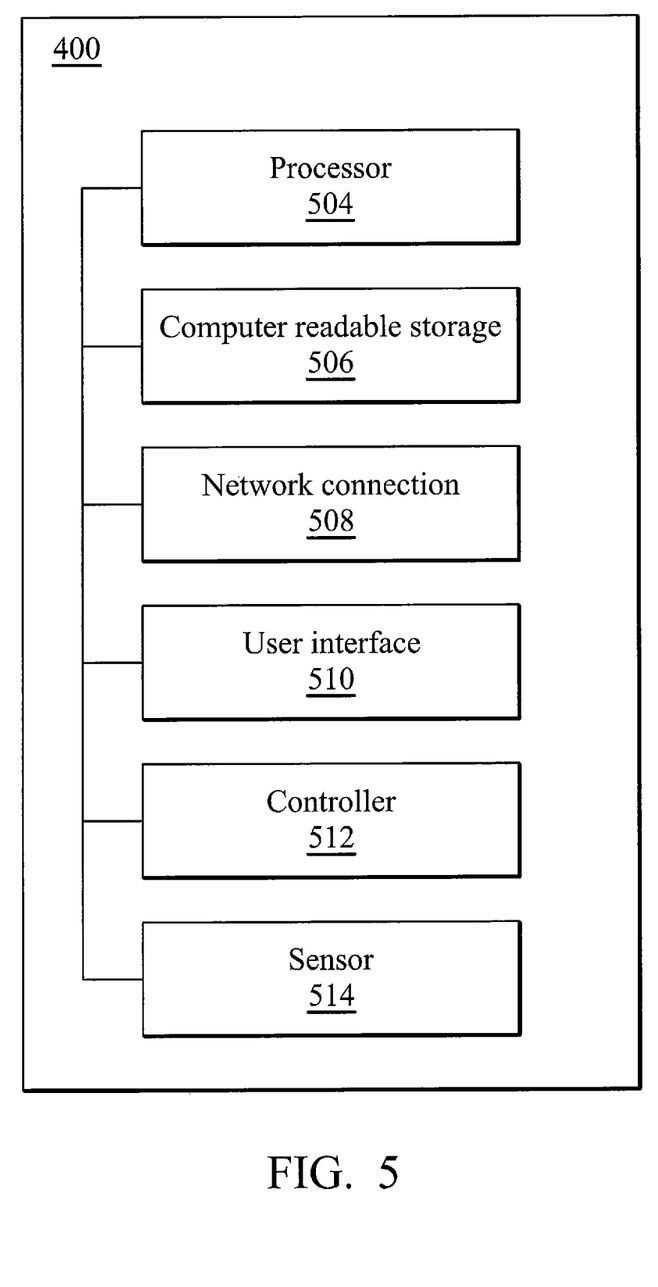
FIG. 5 is a block diagram of various functional modules of the workstation, in accordance with some embodiments.

FIG. 5 is a block diagram of various functional modules of the workstation 400, in accordance with some embodiments. As noted above, the workstation 400 may include loadlocks, a transfer chamber, an alignment chamber, and multiple processing chambers for both etching and plasma ashing in situ within each of the multiple processing chambers. The workstation 400 may also include a processor 504. In further embodiments, the processor 504 may be implemented as one or more processors.

The processor 504 may be operatively connected to a computer readable storage module 506 (e.g., a memory and/or data store), a network connection module 508, a user interface module 510, a controller module 512, and a sensor module 514. In some embodiments, the computer readable storage module 506 may include workstation logic that may configure the processor 504 to perform the various processes discussed herein. The computer readable storage 506 may also store data, such as sensor data characterizing wafer alignment with the robotic arm system, control instructions for a robotic arm to align a wafer, identifiers for a wafer, identifiers for a workstation, identifiers for a semiconductor workpiece fabrication process, and any other parameter or information that may be utilized to perform the various processes discussed herein.

The network connection module 508 may facilitate a network connection of the workstation 400 with various devices and/or components of the workstation 400 that may communicate (e.g., send signals, messages, instructions, or data) within or external to the workstation 400. In certain embodiments, the network connection module 508 may facilitate a physical connection, such as a line or a bus. In other embodiments, the network connection module 508 may facilitate a wireless connection, such as over a wireless local area network (WLAN) by using a transmitter, receiver, and/or transceiver. For example, the network connection module 508 may facilitate a wireless or wired connection with the processor 504 and the computer readable storage 506.

The workstation 400 may also include the user interface module 510. The user interface may include any type of interface for input and/or output to an operator of the workstation 400, including, but not limited to, a monitor, a laptop computer, a tablet, or a mobile device, etc.

The workstation 400 may include a controller module 512. The controller module 512 may be configured to control various physical apparatuses that control movement or functionality for a robotic arm, portal, processing chamber, valve, or any other controllable aspect of the workstation 400. For example, the controller module 512 may be configured to control movement or functionality for at least one of a portal of one of the loadlocks, the alignment chamber, and/or the processing chamber, a rotational motor that rotates the robotic arm system around an axis of rotation, and the like. For example, the controller module 512 may control a motor or actuator. The controller may be controlled by the processor and may carry out the various aspects of the various processes discussed herein.

The sensor module 514 may represent a sensor configured to collect sensor data. As discussed above, in certain embodiments this sensor may collect sensor data characterizing wafer alignment with the robotic arm system. In other embodiments, this sensor may be configured to collect sensor data that characterizes how metal etching and/or plasma ashing is being performed within a processing chamber for both etching and plasma ashing in situ.

In an embodiment, a method includes: receiving, within a processing chamber, a wafer with a photoresist mask above a metal layer, wherein the processing chamber is connected to a gas source; applying an etchant configured to etch the metal layer in accordance with the photoresist mask within the processing chamber; and applying gas from the gas source to perform plasma ashing in the processing chamber.

In another embodiment, a method includes: receiving, within a processing chamber, a wafer with a photoresist mask above a metal layer, wherein the processing chamber is connected to a gas source; applying an etchant configured to etch the metal layer in accordance with the photoresist mask within the processing chamber; applying gas from the gas source to perform plasma ashing in the processing chamber; and removing ash produced during the plasma ashing from the processing chamber.

Yet in another embodiment, a processing chamber includes: an electrostatic chuck configured to secure a wafer, the electrostatic chuck connected with a bias power; at least one coil connected with a source power; a system configured provide an etchant to a metal of the wafer within the processing chamber in accordance with a photoresist mask of the wafer; and a gas intake conduit connected with a gas source, wherein the gas intake conduit is configured to supply the processing chamber with a gas from the gas source during performance of plasma ashing within the processing chamber.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A method, comprising:
   receiving, within a processing chamber, a wafer with a photoresist mask above a metal layer, wherein the processing chamber is connected to a gas source;
   applying an etchant configured to etch the metal layer in accordance with the photoresist mask within the processing chamber;
   inserting gas from the gas source into the processing chamber to perform plasma ashing in the processing chamber, wherein the applying of the etchant and the plasma ashing are performed in the processing chamber, wherein:
   the gas comprises a mixture of $N_2$ and $O_2$;
   the metal layer is aluminum (Al);
   the applying of the etchant comprises applying a dry etchant selected from a group consisting of: $Cl_2$, $CCl_4$, $SiCl_4$, and/or $BCl_3$ so as to produce $AlCl_3$ as an etching byproduct;
   the $O_2$ reacts with the photoresist in accordance with $C_xH_yO_z + O_2 \rightarrow CO_2 + CO + H_2O$; and
   the $N_2$ reacts with the etching byproduct $AlCl_3$ in accordance with $AlCl_3 + N_2 \rightarrow AlN + Cl_2$; and
   applying a source power of over 1600 watts while maintaining the processing chamber at a temperature range of 40 to 60 degrees centigrade to perform the plasma ashing, wherein the source power is applied to at least one coil in the processing chamber, and the processing chamber comprises a wall that separates the at least one coil from the metal layer.

2. The method of claim 1, further comprising removing the $CO_2 + CO + H_2O$ and the $AlN + Cl_2$ by a pump.

3. The method of claim 1, wherein the processing chamber is maintained at 50 degrees centigrade.

4. The method of claim 3, wherein the at least one coil faces a first surface of the wall and the metal layer faces a second surface of the wall opposite the first surface, wherein the source power is applied to the at least one coil.

5. The method of claim 1, further comprising:
   applying a bias power of about 0 watts to perform the plasma ashing.

6. The method of claim 5, wherein the wafer contacts an electrostatic chuck, and the bias power is applied to the electrostatic chuck.

7. A method, comprising:
   receiving, within a processing chamber, a wafer with a photoresist mask above a metal layer, wherein the processing chamber is connected to a gas source;
   applying an etchant configured to etch the metal layer in accordance with the photoresist mask within the processing chamber;
   inserting gas from the gas source into the processing chamber to perform plasma ashing in the processing chamber, wherein the applying of the etchant and the plasma ashing are performed in the processing chamber;
   applying a source power of over 1600 watts while maintaining the processing chamber at a temperature range of 40 to 60 degrees centigrade to perform the plasma ashing; and
   removing ash produced during the plasma ashing from the processing chamber, wherein the source power is applied to at least one coil in the processing chamber, and the processing chamber comprises a wall that separates the at least one coil from the metal layer, wherein:
   the gas comprises a mixture of $N_2$ and $O_2$;
   the metal layer is aluminum (Al);
   the applying of the etchant comprises applying a dry etchant selected from a group consisting of: $Cl_2$, $CCl_4$, $SiCl_4$, and/or $BCl_3$ so as to produce $AlCl_3$ as an etching byproduct;
   the $O_2$ reacts with the photoresist in accordance with $C_xH_yO_z + O_2 \rightarrow CO_2 + CO + H_2O$; and
   the $N_2$ reacts with the etching byproduct $AlCl_3$ in accordance with $AlCl_3 + N_2 \rightarrow AlN + Cl_2$.

8. The method of claim 7, further comprising:
   applying a pressure of less than 100 millitorr throughout the processing chamber to perform the plasma ashing.

9. The method of claim 7, further comprising:
   maintaining the processing chamber at about 50 degrees centigrade to perform the plasma ashing.

10. The method of claim 7, further comprising:
    transforming the gas from the gas source into a form of plasma to perform the plasma ashing in the processing chamber.

11. The method of claim 7, wherein the metal layer is formed on top of a layer comprising silicon oxide.

12. The method of claim 7, further comprising removing the $CO_2+CO+H_2O$ and the $AlN+Cl_2$ by a pump.

13. A method, comprising:
receiving, within a processing chamber, a wafer with a photoresist mask above a metal layer, wherein the processing chamber is connected to a gas source;
applying an etchant configured to etch the metal layer in accordance with the photoresist mask within the processing chamber;
inserting gas from the gas source into the processing chamber;
applying a source power of over 1600 watts while maintaining the processing chamber at a temperature range of 40 to 60 degrees centigrade to perform plasma ashing, wherein the applying of the etchant and the plasma ashing are performed in the processing chamber; and
removing ash produced during the plasma ashing from the processing chamber, wherein the source power is applied to at least one coil in the processing chamber, and the processing chamber comprises a wall that separates the at least one coil from the metal layer, wherein:

the gas comprises a mixture of $N_2$ and $O_2$;
the metal layer is aluminum (Al);
the applying of the etchant comprises applying a dry etchant selected from a group consisting of: $Cl_2$, $CCl_4$, $SiCl_4$, and/or $BCl_3$ so as to produce $AlCl_3$ as an etching byproduct;
the $O_2$ reacts with the photoresist in accordance with $CxHyOz+O_2 \rightarrow CO_2+CO+H_2O$; and
the $N_2$ reacts with the etching byproduct $AlCl_3$ in accordance with $AlCl_3+N_2 \rightarrow AlN+Cl_2$.

14. The method of claim 13, further comprising:
maintaining the processing chamber at about 50 degrees centigrade to perform the plasma ashing.

15. The method of claim 13, wherein the metal layer is formed on top of a layer comprising silicon oxide.

16. The method of claim 13, wherein the gas from the gas source comprises pure oxygen or pure nitrogen.

17. The method of claim 13, further comprising removing the $CO_2+CO+H_2O$ and the $AlN+Cl_2$ by a pump.

\* \* \* \* \*